United States Patent [19]

Murahashi et al.

[11] Patent Number: 4,763,134
[45] Date of Patent: Aug. 9, 1988

[54] LASER RECORDING APPARATUS HAVING VARIABLE RECORDING MAGNIFICATION AND BEAM INTENSITY CONTROL

[75] Inventors: Takashi Murahashi, Hino; Yoshiyuki Ichihara, Chofu; Toshihiko Nakazawa, Hachioji; Toshihiro Takesue, Musashino, all of Japan

[73] Assignee: Konishiroku Photo Industry Co., Tokyo, Japan

[21] Appl. No.: 898,262

[22] Filed: Aug. 20, 1986

[30] Foreign Application Priority Data

Aug. 29, 1985 [JP] Japan ............................. 60-188509
Aug. 29, 1985 [JP] Japan ............................. 60-188510

[51] Int. Cl.[4] .............................................. G01D 9/42
[52] U.S. Cl. .................................. 346/1.1; 346/108; 358/296; 369/116
[58] Field of Search ............... 369/116; 358/296; 346/160, 108, 76 L, 107 R, 1.1

[56] References Cited

U.S. PATENT DOCUMENTS

| 3,736,046 | 5/1973 | Zook | 346/108 |
| 3,982,253 | 9/1976 | Goshima et al. | 346/108 X |
| 4,310,858 | 1/1982 | Hareng et al. | 358/296 X |
| 4,449,153 | 5/1984 | Tschang | 346/108 X |
| 4,642,701 | 2/1987 | Maeda et al. | 358/296 |

Primary Examiner—E. A. Goldberg
Assistant Examiner—Mark Reinhart
Attorney, Agent, or Firm—Jordan B. Bierman

[57] ABSTRACT

A laser recording apparatus wherein an image is recorded by laser beam scanning, and a stop amount of a stop is varied in accordance with recording magnification. The stop is disclosed at a position whereat it can vary the beam radius of a laser beam incident in a focusing lens. The optical intensity of a laser beam is varied in accordance with the recording magnification.

12 Claims, 3 Drawing Sheets

LASER RECORDING APPARATUS HAVING VARIABLE RECORDING MAGNIFICATION AND BEAM INTENSITY CONTROL

BACKGROUND OF THE INVENTION

1. Field of the Invention

The present invention relates to a laser recording apparatus which is so designed that the spot radius of a laser beam can be varied with a simple construction.

2. Description of the Prior Art

Recently, a laser recording apparatus (a so-called laser printer) which records an image by using a laser beam has been developed and put to practical use. The laser recording apparatus is so devised that a laser beam is modulated by an electric signal signifying an image information, and this image information is formed on a photosensitive member by the laser beam and recorded thereon as a visual image by an electrophotographic process or the like.

In the case when recording magnification is varied in the laser recording apparatus of this kind, it is desirable that the spot radius of a laser beam on a recording medium is made variable in accordance with said magnification.

FIG. 4 shows schematically the construction of a scanning optical system of a prior-art laser recording apparatus. Numeral 1 denotes a laser light source such as a semiconductor laser, 2 a collimator lens for making a beam parallel and forming it in a desired shape, 3 a beam expander for expanding the radius of the beam, 4 a rotary polyhedral mirror for scanning which rotates at high speed for deflecting the beam, 5 an $f\theta$ lens forming an image at a distance proportional to an incident angle $\theta$ to an optical axis, and 6 a photosensitive member, a recording medium, on which an electrostatic latent image of an image is recorded.

With a view to varying the spot radius of a laser beam, a method has been proposed heretofore (in Japanese Patent Laid-Open No. 17716/1985, for instance) in which the beam expander 3 is constructed of two sets of lens systems 3a, 3b, and 3c, 3d, for instance, and these sets of the lens systems are switched over for employment in accordance with the recording magnification at the time of selection by a rotating operation, as shown in FIG. 4. A method in which a zoom lens is used in place of the beam expander 3 is known as well.

Both of these methods have problems that they involve an increase in the sizes of a switching mechanism and the apparatus itself, that the radius of a beam spot can not be varied consecutively in the method in which the switchable beam expander is employed, and that a zoom lens mechanism is very expensive in the method in which the zoom lens is employed.

By the way, the optical intensity of a laser beam is in a Gaussian distribution as shown in FIG. 5, and the distribution of said intensity is expressed by the following equation.

$$I = I_0 e^{-a^2 x^2}$$

(where a is a constant). The radius of a beam at a given time can be determined from the value of x at the time when the optical intensity I is $1/e^2$ of the maximum intensity $I_0$, and therefore a beam radius $D_0$ in this case is $$D_0 = 2 \times 1/a.$$

This value is constant irrespective of the maximum optical intensity $I_0$.

However, as is apparent from FIG. 6, in which the threshold value of an optical intensity required for a laser beam to be recorded on a recording medium is denoted by $\alpha$, the radius d of a spot recorded actually varies in accordance with the difference in the optical intensity even when the radius of the beam is constant. That is, the spot radius d increases ($d_1 > d_0$) with an increase in the optical intensity I ($I_1 > I_0$).

SUMMARY OF THE INVENTION

The present invention has been contrived in view of the above-described problems, and it has an object of making variable the spot radius of a laser beam on a recording medium with a simple construction. In order to achieve this object, a stop means is disposed in an optical system of a laser recording apparatus, and the stop amount of the stop means is designed to be variable in accordance with recording magnification.

Moreover, in order to achieve the aforesaid object, the optical intensity of a laser beam is designed to be varied in accordance with the recording magnification.

DESCRIPTION OF THE PREFERRED EMBODIMENTS

The following is a description of the present invention on the basis of the drawings.

Figure 1:
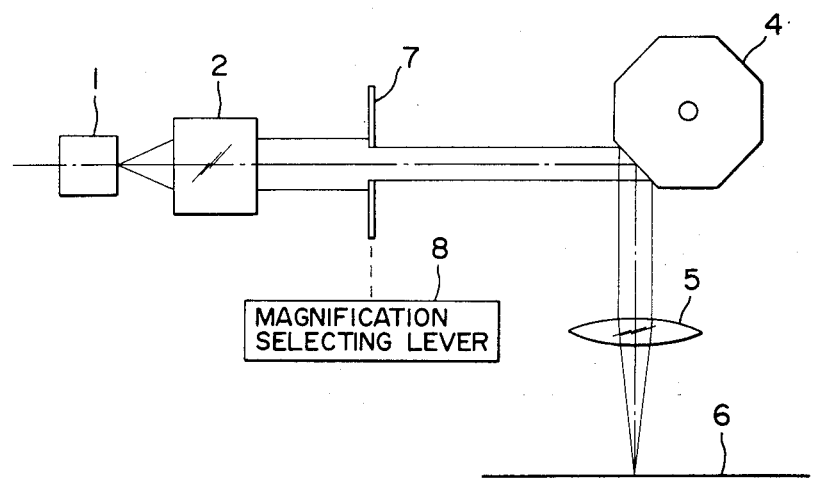
FIGS. 1 to 3 are schematic diagrams showing embodiments of a laser recording apparatus according to the present invention.
Figure 4:
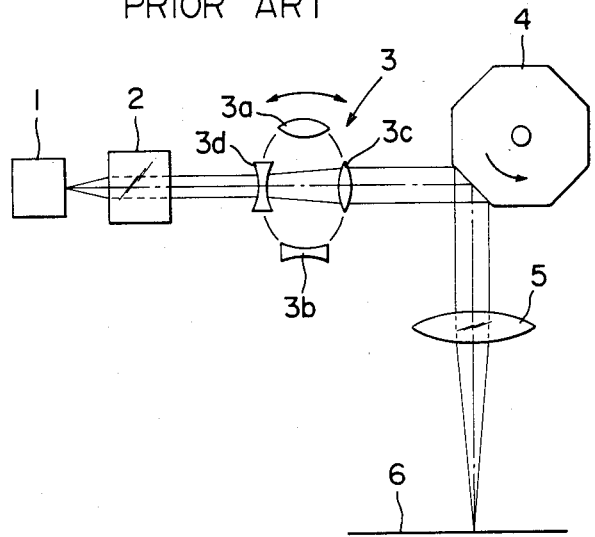
FIG. 4 is a schematic diagram showing a constructure of a scanning optical system of a laser recording apparatus.

FIG. 1 is a schematic diagram showing one embodiment of a laser recording apparatus according to the present invention, and in this figure, the same components with those in FIG. 4 are denoted by the same reference numbers. Numeral 7 denotes a stop provided on an optical path between a collimator lens 2 and a rotary polyhedral mirror 4. It is constituted by an optical stop used for a conventional camera, or the like, and the stop amount thereof is determined in accordance with the magnification of an image by a magnification selecting lever 8.

The spot radius d of a laser beam can be determined, by the following equation, from the focal length f of the $f\theta$ lens and the radius D of the beam incident in the $f\theta$ lens.

$$d = 4\lambda f / \pi D$$

($\lambda$ denotes a wavelength).

Accordingly, the spot radius d of the laser beam on a recording medium can be varied by changing the stop amount of the stop 7 in FIG. 1 so as to vary the radius D of the beam falling on the fθ lens.

Figure 2:
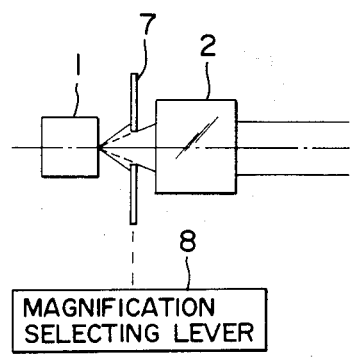
Figure 3:
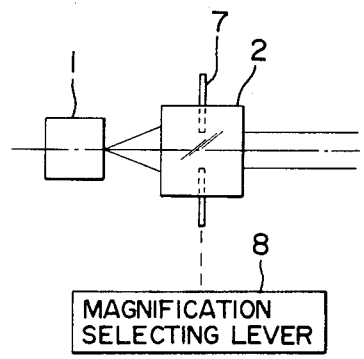

Next, other embodiments of the laser recording apparatus according to the present invention are shown in FIGS. 2 and 3. In these figures, the same components with those in FIG. 1 are shown with the same reference numbers given thereto.

In the embodiment of FIG. 2, the stop 7 is provided on an optical path between the laser light source 1 and the collimator lens 2, while in the embodiment of FIG. 3, the stop 7 is provided in integration with the collimator lens 2, as shown in the figures.

In the above-described embodiments, the stop means is provided in an optical system, and the spot radius of a laser beam is varied by changing the stop amount of the means. This stop means may be provided singly or in combination with the aforesaid means of varying the optical intensity.

Owing to such disposition of the stop means in the optical system of a laser scanning device and such construction enabling the variation of the stop amount of said stop means in accordance with the recording magnification as described above, the present invention has an effect that the spot radius of a laser beam on a recording medium can be varied by a simple construction.

Figure 7:
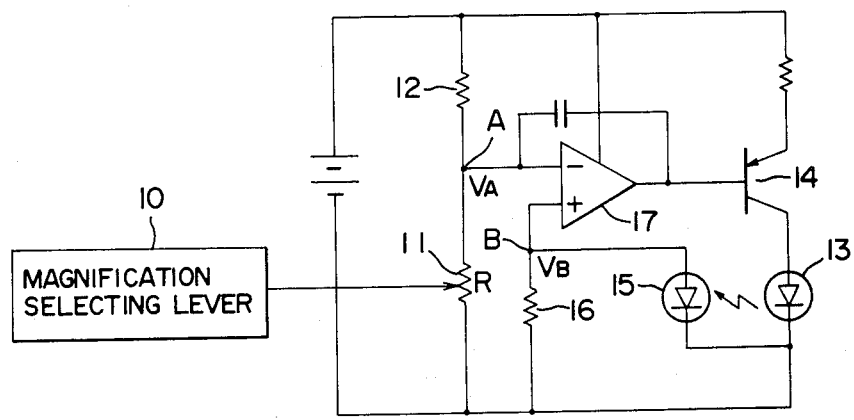
FIG. 7 shows a semiconductor laser driving circuit of the laser recording apparatus according to the present invention.
Figure 5:
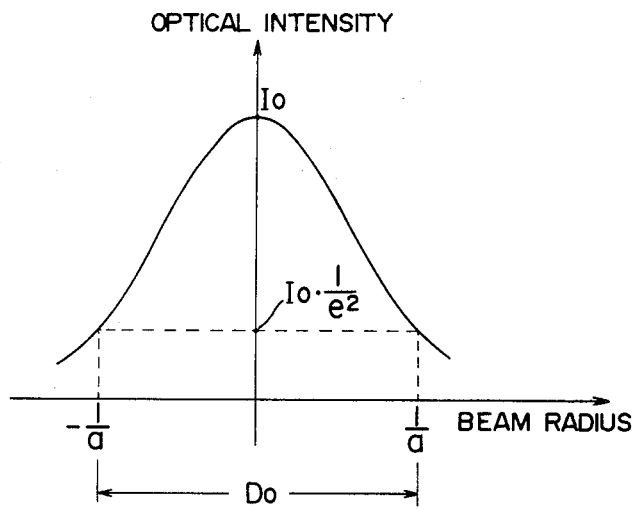
FIG. 5 is an intensity distribution graph showing the relationship between the beam radius of a laser beam and the optical intensity thereof.

FIG. 7 shows a semiconductor laser driving circuit used in the laser recording apparatus according to the present invention. Numeral 10 denotes a magnification selecting lever, and by the operation of this lever, the resistance value R of a variable resistor 11 is varied. The recording magnification may be varied either in stages or in succession, and the resistance value R is designed to increase with an increase in the recording magnification. A fixed resistor 12 is connected in series to the variable resistor 11, and a potential $V_A$ at a node A is determined in accordance with the recording magnification selected. Numeral 13 denotes a semiconductor laser, and a driving current flowing through the laser 13 is controlled by a transistor 14 connected thereto in series.

The optical output of the semiconductor laser 13, i.e. the quantity of light thereof, is detected by a photodiode 15, and a voltage drop occurs in proportion to a current flowing through the photodiode 15 by the presence of a resistor 16, whereby a potential at a node B is determined.

Figure 6:
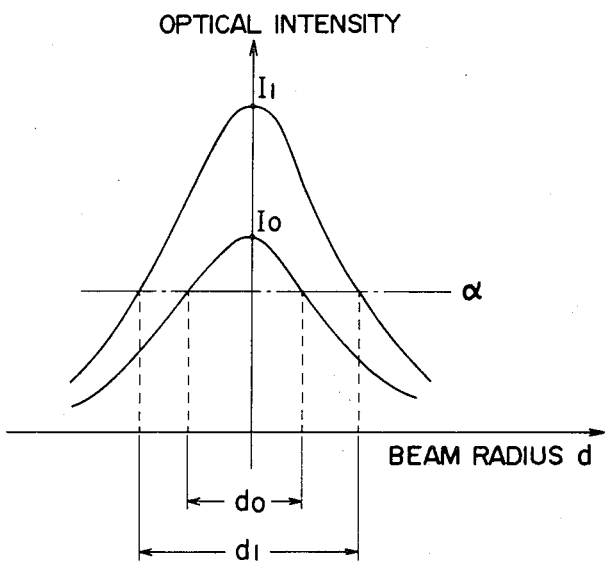
FIG. 6 is a graph showing a variation in a spot radius in accordance with the optical intensity of the laser beam.

Numeral 17 denotes a comparator, which compares the potential $V_A$ at the node A with the potential $V_B$ at the node B and drives the transistor 14 in accordance ($V_B - V_A$) when $V_B > V_A$, and the driving current of the semiconductor laser 13 is controlled by the output of this comparator 17. On the occasion, the potential $V_A$ at the node A varies according to the recording magnification, and $V_A$ increases as the recording magnification is raised. Since the output voltage of the comparator 17 decreases on the occasion, a collector current of the transistor 14 increases, and thereby the driving current of the semiconductor laser 13 is made to increase. This results in an increase in the optical intensity, and thereby the spot radius is enlarged, as is seen from FIG. 6. When the recording magnification is lowered, to the contrary, the value $V_A$ decreases, the output voltage of the comparator 17 increases, and the collector current of the transistor 14 decreases, thereby the driving current of the semiconductor laser 13 being reduced. This results in a decrease in the optical intensity, and thereby the spot radius is lessened as is seen from FIG. 4. The driving current of the semicondutor laser 13 is varied consecutively by changing the recording magnification consecutively, and accordingly, the spot radius of the beam is varied also consecutively.

In the driving circuit shown in the figure, an automatic feedback control of a laser light output is executed, and thus an automatic function of adjusting the quantity of light operates. The description with this respect is omitted, however, since it is not the point of the present invention.

Since the construction is so designed that the optical intensity of a laser beam can be varied in accordance with the recording magnification, in these embodiments of the present invention, as described above, the spot radius of the laser beam can be varied by an inexpensive and simple circuit construction without involving an increase in the sizes of the apparatus and mechanisms.

What is claimed is:

1. A laser recording apparatus comprising:
   a laser light source for emitting a light beam,
   collimator means for making the beam parallel,
   scanning means for scanning the beam onto a photosensitive surface,
   focusing means for focusing the beam to form a spot image,
   a photosensitive surface onto which the spot image of the light beam is directed to form a latent image for transfer to a recording medium,
   improved means for selecting a recording magnification for an image formed on the photosensitive surface by selecting a corresponding radius of the light beam, including aperture means for forming an aperture of a selected radius through which the light beam is directed, and
   laser drive means for driving the laser light source to emit a light beam of an intensity which is varied in accordance with the desired recording magnification, said laser drive means being operated to emit a light beam of an intensity distribution having an effective recording radius of light capable of forming a recording image which corresponds to the selected radius for the light beam set by said aperture means.

2. A laser recording apparatus of claim 1, wherein said aperture means is interposed in a light path of the beam between the laser light source and the focusing means, said aperture means having a light stoppng member which is interposed variably across the light beam path to set the radius of the light beam to a selected radius in accordance with a desired recording magnification.

3. A laser recording apparatus of claim 1, wherein said aperture means is provided between the laser light source and the collimator.

4. A laser recording apparatus of claim 1, wherein said aperture means is provided between the collimator and the scanning means.

5. A laser recording apparatus of claim 1, wherein said aperture means is provided integrally with the collimator.

6. A laser recording apparatus of claim 1, wherein said improved means includes magnification selecting means connected to said aperture means and said laser drive means for controlling the light beam radius cooperatively with the light beam radius to obtain the desired recording magnification in response to a selection input to said magnification selecting means.

7. A laser recording apparatus of claim 6, wherein said laser light source is a semiconductor laser, and said laser drive means includes a semiconductor driving circuit for providing a driving current through the semiconductor laser, said circuit being controlled in response to said magnification selecting means.

8. A method for selecting a recording magnification of a laser recording apparatus having a laser light source for emitting a light beam, collimator means for making the beam parallel, scanning means for scanning the beam onto a photosensitive surface, focusing means for focusing the beam to form a spot image, and a photosensitive surface onto which the spot image of the light beam is directed to form a latent image for transfer to a recording medium, wherein the recording magnification is selected by correspondingly varying the radius of the light beam by the steps of:

forming an aperture of a selected radius by aperture means interposed through which the light beam is directed, and driving the laser light source to emit a light beam of an intensity which is varied in accordance with the desired recording magnification, such that said laser light source emits a light beam of an intensity distribution having an effective recording radius of light capable of forming a recording image which corresponds to the selected radius for the light beam set by said aperture means.

9. A laser recording method of claim 8, wherein said aperture forming step includes providing said aperture means with a light stopping member which is interposed variably across the light beam path to set the radius of the light beam to a selected radius in accordance with a desired recording magnification.

10. A laser recording apparatus comprising:
a laser light source for emitting a light beam,
collimator means for making the beam parallel,
scanning means for scanning the beam onto a photosensitive surface,
focusing means for focusing the beam to form a spot image,
a photosensitive surface onto which the spot image of the light beam is directed to form a latent image for transfer to a recording medium,
improved means for selecting a recording magnification for an image formed on the photosensitive surface by selecting a corresponding radius of the light beam, and
laser drive means for driving the laser light source to emit a light beam of an intensity which is varied in accordance with the desired recording magnification, said laser drive means being operated to emit a light beam of an intensity distribution having an effective recording radius of light capable of forming a recording image which corresponds to the selected radius.

11. A laser recording apparatus comprising a laser light source for emitting a light beam, collimator means for making the beam parallel, scanning means for scanning the beam onto a photosensitive surface, focusing means for focusing the beam to form a spot image, a photosensitive surface onto which the spot image of the light beam is directed to form a latent image for transfer to a recording medium, and an improved means for selecting a recording magnification including aperture means for forming an aperture of variable radius inteposed in the light path of the beam between the laser light source and the focusing means, said aperture means having a light stopping member which is interposed variably across the light beam path to set the radius of the light beam to a selected radius in accordance with a desired recording magnification.

12. A method for selecting a recording magnification of a laser recording apparatus having a laser light source for emitting a light beam, collimator means for making the beam parallel, scanning means for scanning the beam onto a photosensitive surface, focusing means for focusing the beam to form a spot image, a photosensitive surface onto which the spot image of the light beam is directed to form a latent image for transfer to a recording medium, wherein said method comprises varying the recording magnification by varying the radius of the light beam, by the step of forming an aperture of variable radius inteposed in the light path of the beam between the laser light source and the focusing means, said aperture means having a light stoping member which is interposed variably across the light beam path to set the radius of the light beam to a selected radius in accordance with a desired recording magnification.

* * * * *